United States Patent [19]
Shinozaki

[11] Patent Number: 5,990,730
[45] Date of Patent: Nov. 23, 1999

[54] SEMICONDUCTOR DEVICE WITH STABLE OPERATION AND REDUCED POWER CONSUMPTION

[75] Inventor: Naoharu Shinozaki, Kawasaki, Japan

[73] Assignee: Fujitsu Limited, Kanagawa, Japan

[21] Appl. No.: 09/107,138

[22] Filed: Jun. 30, 1998

[30] Foreign Application Priority Data

Feb. 3, 1998 [JP] Japan .................................. 10-022256

[51] Int. Cl.[6] ...................................................... G06F 1/32
[52] U.S. Cl. ........................ 327/544; 327/143; 365/227; 365/233
[58] Field of Search ..................................... 327/142, 143, 327/198, 544; 365/226, 227, 233

[56] References Cited

U.S. PATENT DOCUMENTS 5,623,453  4/1997  Shinozaki ................................ 365/233
5,822,255  10/1998  Uchida ..................................... 365/194
5,894,446  4/1999  Itou ......................................... 365/222

*Primary Examiner*—Tuan T. Lam
*Attorney, Agent, or Firm*—Nikaido Marmelstein Murray & Oram LLP

[57] ABSTRACT

A semiconductor device which performs a predetermined operation includes a timing-stabilization circuit which performs a timing adjustment with respect to an internal clock signal, and a current-consumption circuit which consumes a predetermined amount of a current so as to emulate conditions of such current consumption as would be observed during the predetermined operation of the semiconductor device. The semiconductor device further includes a start-up-period control circuit which makes the timing-stabilization circuit and the current-consumption circuit operate at a beginning of power supply so as to perform the timing adjustment under the conditions, and stops operations of the timing-stabilization circuit and the current-consumption circuit after completion of the timing adjustment.

9 Claims, 15 Drawing Sheets

SEMICONDUCTOR DEVICE WITH STABLE OPERATION AND REDUCED POWER CONSUMPTION

BACKGROUND OF THE INVENTION

1. Field of the Invention

The present invention generally relates to semiconductor devices, and particularly relates to a semiconductor device equipped with a timing-stabilization circuit.

2. Description of the Related Art

Semiconductor devices such as SDRAMs (synchronous dynamic random access memories), which operate in synchronism with a synchronization signal, need a mechanism for stabilizing a data-access time and a data-hold time relative to the synchronization signal in order to achieve a faster operation speed. To meet this demand, a timing-stabilization circuit such as a DLL (delay-locked loop) circuit is provided in the semiconductor devices for the purpose of stabilizing the internal-clock signals used for data input/output.

FIG. 1 is a block diagram of a circuit which adjusts a data-output timing based on a DLL circuit.

The circuit of FIG. 1 includes an input circuit 501, a variable-delay circuit 502, an output circuit 503, a phase comparator 504, a delay-control circuit 505, a dummy-variable-delay circuit 506, a dummy-output circuit 507, and a dummy-input circuit 508.

A clock signal CLK input to the input circuit 501 is compared with a reference voltage level, and is output from the input circuit 501 as a clock signal i-clk. The clock signal i-clk is then delayed by the variable-delay circuit 502 by an appropriate delay amount, and is supplied to the output circuit 503. The output circuit 503 uses the supplied internal-clock signal as a synchronization signal for latching data DATA which is to be output from the device. The latched data DATA is then supplied from the output circuit 503 to an exterior of the semiconductor device as data DQ.

The signal path from an input node of the clock signal CLK to the output circuit 503 inevitably introduces a delay which is inherent to the circuit, so that the data DQ output to the exterior of the device has a timing displacement relative to the clock signal CLK. In order to ensure that the data DQ output from the output circuit 503 is adjusted to have a predetermined timing relation with the externally provided clock signal CLK, a DLL circuit mainly comprised of the phase comparator 504, the delay-control circuit 505, and the dummy-variable-delay circuit 506 is employed.

The clock signal i-clk is supplied to the dummy-variable-delay circuit 506. The dummy-variable-delay circuit 506 is controlled to delay the clock signal i-clk by the same delay amount as that applied by the variable-delay circuit 502. The delayed-clock signal output from the dummy-variable-delay circuit 506 is then supplied to the dummy-output circuit 507, which emulates the output circuit 503. The clock signal output from the dummy-output circuit 507 is supplied as a dummy-clock signal d-i-clk to the phase comparator 504 via the dummy-input circuit 508, which has the same delay characteristics as the input circuit 501.

The phase comparator 504 makes a comparison of the clock signal i-clk with the dummy-clock signal d-i-clk in terms of their phases. To ensure that both clock signals have the same phase, the phase comparator 504 controls the delay amount of the dummy-variable-delay circuit 506 via the delay-control circuit 505. In this manner, the clock signal output from the dummy-output circuit 507 is adjusted so as to have a predetermined timing relation with the input clock signal CLK.

A total delay of the variable-delay circuit 502 and the output circuit 503 is equal to a total delay of the dummy-variable-delay circuit 506 and the dummy-output circuit 507. Because of this, when the clock signal output from the dummy-output circuit 507 has the predetermined timing relation with the input clock signal CLK, the data DQ output from the output circuit 503 to the exterior of the device ends up having the same predetermined timing relation with the input clock signal CLK.

In this configuration, even when the characteristics of the input circuit 501, the variable-delay circuit 502, and the output circuit 503 are changed due to variations in a power voltage and/or temperature, the characteristics of the dummy-input circuit 508, the dummy-variable-delay circuit 506, and the dummy-output circuit 507 also change in the same manner. Because of this, the data DQ output from the output circuit 503 to the exterior of the device always keeps the same timing relation with the input clock signal CLK regardless of a power-voltage variation and/or a temperature variation.

The DLL circuit shown in FIG. 1 operates at each clock cycle or every sampled cycle selected at predetermined intervals so as to effect clock-stabilization control. The DLL circuit, however, tends to exhibit unstable operations because of excessive sensitivity to noise. When the DLL circuit operates at all times, therefore, there is a high likelihood that the semiconductor device ends up showing an unstable operation. Further, incessant operations of the DLL circuit give rise to a problem that the semiconductor device consumes an excessive power.

Accordingly, there is a need for a semiconductor device equipped with a DLL circuit which can maintain stable operations while achieving a reduction in power consumption.

SUMMARY OF THE INVENTION

Accordingly, it is a general object of the present invention to provide a semiconductor device which can satisfy the need described above.

It is another and more specific object of the present invention to provide a semiconductor device equipped with a DLL circuit which can maintain stable operations while achieving a reduction in power consumption.

In order to achieve the above objects according to the present invention, a semiconductor device which performs a predetermined operation includes a timing-stabilization circuit which performs a timing adjustment with respect to an internal clock signal, and a current-consumption circuit which consumes a predetermined amount of a current so as to emulate conditions of such current consumption as would be observed during the predetermined operation of the semiconductor device. The semiconductor device further includes a start-up-period control circuit which makes the timing-stabilization circuit and the current-consumption circuit operate at a beginning of power supply so as to perform the timing adjustment under the conditions, and stops operations of the timing-stabilization circuit and the current-consumption circuit after completion of the timing adjustment.

According to one aspect of the present invention, the semiconductor device described above further includes a first circuit which generates a first signal upon detecting the beginning of power supply, wherein the start-up-period control circuit makes the timing-stabilization circuit and the current-consumption circuit operate in response to the first signal.

According to another aspect of the present invention, the semiconductor device described above further includes a second circuit which generates a second signal in response to an external input supplied in conjunction with a start of operations of the semiconductor device, wherein the start-up-period control circuit stops operations of the timing-stabilization circuit and the current-consumption circuit in response to the second signal.

According to another aspect of the present invention, the semiconductor device described above is such that the current-consumption circuit includes at least one transistor.

According to another aspect of the present invention, the semiconductor device described above is such that the current-consumption circuit further includes a resistor connected in series with the at least one transistor.

According to another aspect of the present invention, the semiconductor device described above is such that the at least one transistor has an ON resistance smaller than a resistance of the resistor, and a temperature-dependent resistance change of the resistor is smaller that a temperature-dependent ON-resistance change of the at least one transistor.

According to another aspect of the present invention, the semiconductor device described above is such that the current-consumption circuit includes a plurality of separate circuits provided at different positions within the semiconductor device, each of the separate circuits consuming a respective current.

According to another aspect of the present invention, the semiconductor device described above is such that the timing-stabilization circuit includes a DLL circuit.

According to another aspect of the present invention, the semiconductor device described above further includes a plurality of timing-stabilization circuits each performing a respective timing adjustment regarding a respective internal clock signal, the plurality of timing-stabilization circuits including the timing-stabilization circuit, and a plurality of current-consumption circuits which consumes a respective predetermined amount of a current with respect to a respective power voltage, the current-consumption circuits including the current-consumption circuit, wherein the start-up-period control circuit makes the plurality of timing-stabilization circuits and the plurality of current-consumption circuits operate at the beginning of power supply, and stops operations of the plurality of timing-stabilization circuits and the plurality of current-consumption circuits after completion of the respective timing adjustment, thereby performing the respective timing adjustment under such respective conditions as would be observed when the semiconductor device operates by using the respective clock signal.

In the present invention described above, the current-consumption circuit consumes the predetermined amount of a current which would be consumed during the period when the semiconductor device performs the predetermined operation, and uses the timing-stabilization circuit such as a DLL circuit to make a timing adjustment of the internal clock signal under conditions of such current consumption. This timing adjustment is conducted immediately after the beginning of supply of a power voltage to the semiconductor device. When the semiconductor device starts operations thereof after a completion of the timing adjustment, the current-consumption circuit stops operating, and the timing-stabilization circuit also stops operations thereof so as to fix the timing of the internal clock signal to an adjusted timing. After this, the internal clock signal having this fixed timing will be used at all times. When the semiconductor device engages in the predetermined operation subsequent to the start of operations thereof, therefore, the internal clock signal provides an optimal timing since the internal clock signal has been adjusted under such conditions of current consumption as would be observed during this predetermined operation.

In this manner, the present invention allows the predetermined amount of a current to be consumed as an emulation immediately after the beginning of power supply, and the timing of the internal clock signal is adjusted under such emulated conditions, with subsequent fixing of the timing after completion of the adjustment. Because of this, when the semiconductor device performs normal operations thereof, the internal clock signal can provide an appropriate timing under such current-consumption conditions as are observed during the period when the semiconductor device conducts the predetermined operation. This achieves stable operations free from an influence of noise, and reduces excessive current consumption which would be otherwise consumed by the timing-stabilization circuit.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 2:
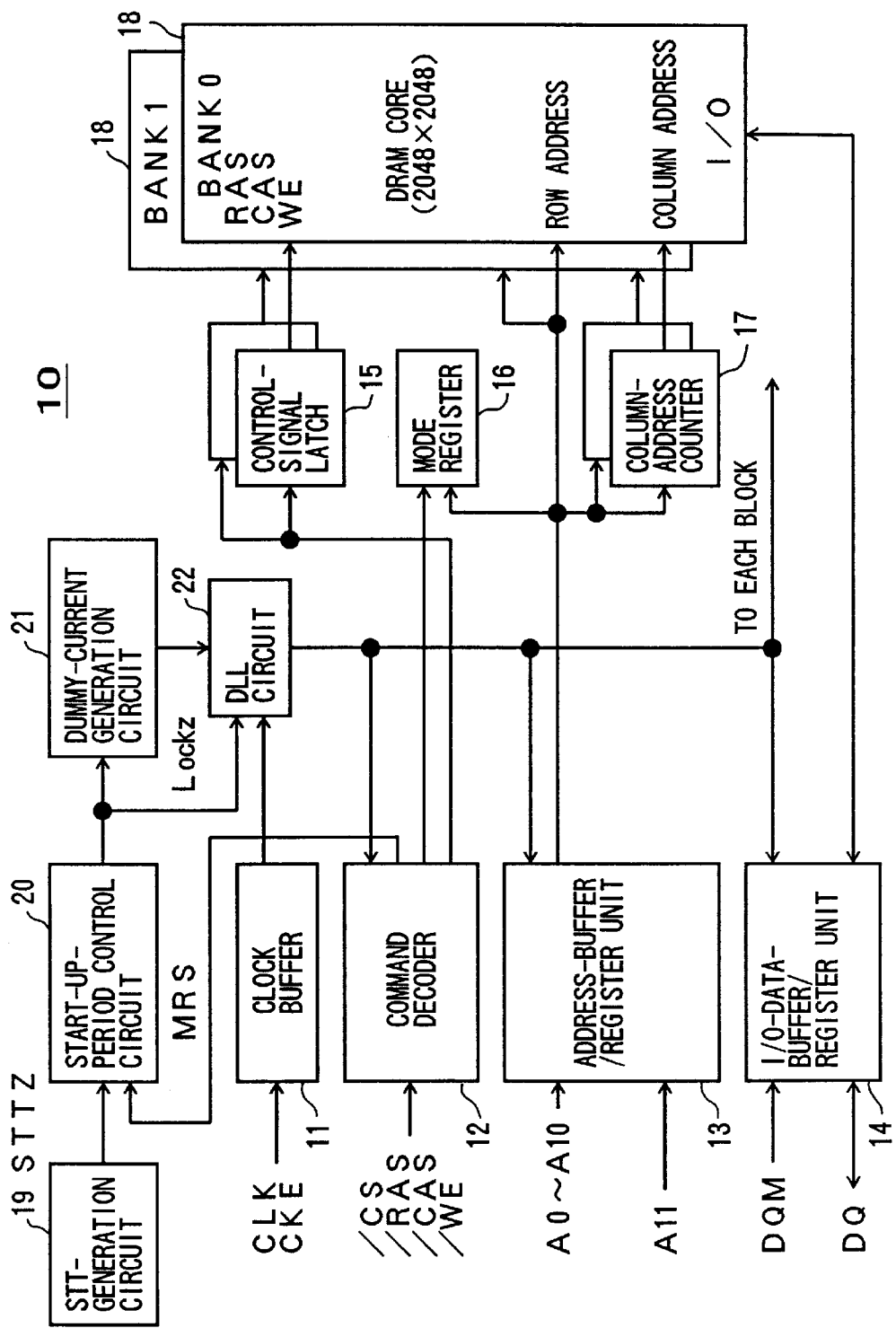
FIG. 2 is a block diagram of an embodiment of a semiconductor device according to the present invention.

FIG. 2 is a block diagram of an embodiment of a semiconductor device according to the present invention. In FIG. 2, a synchronous-type semiconductor memory device is used as an example of a semiconductor device of the present invention.

Figure 1:
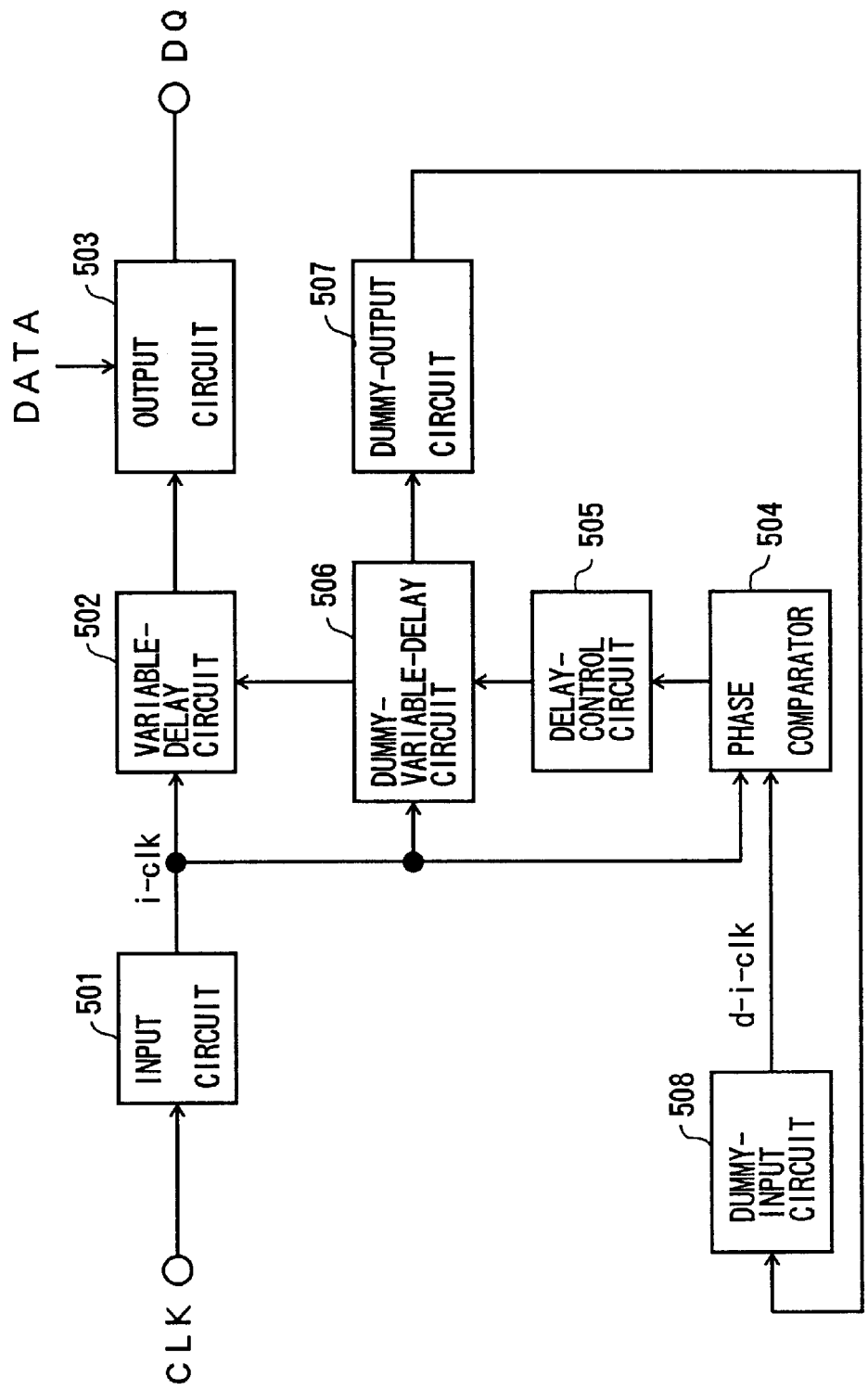
FIG. 1 is a block diagram of a related-art circuit which adjusts a data-output timing based on a DLL circuit.

A semiconductor memory device 10 of FIG. 1 includes a clock buffer 11, a command decoder 12, an address-buffer/register unit 13, an I/O-data-buffer/register unit 14, a control-signal latch 15, a mode register 16, a column-address counter 17, a plurality of banks 18, an stt-generation circuit 19, a start-up-period control circuit 20, a dummy-current generation circuit 21, and a DLL circuit 22. Each of the banks 18 is a DRAM core circuit which includes a memory-cell array, sense amplifiers, and so on. In the example of FIG. 2, two banks 18 are shown. The control-signal latch 15 and the column-address counter 17 are each provided for each of the banks 18.

The clock buffer 11 receives the clock signal CLK when the clock-enable signal CKE is enabled, and supplies the same to the DLL circuit 22. The DLL circuit 22 generates an internal clock signal by adjusting a timing of the clock signal CLK. The internal clock signal is supplied to the command decoder 12, the address-buffer/register unit 13, and the I/O-data-buffer/register unit 14 to be used as a synchronization signal. The internal clock signal is further provided to each internal circuit of the semiconductor memory device 10 for the purpose of effecting synchronization control of the internal circuits.

The command decoder 12 receives control signals /CS (chip select), /RAS (row address strobe), /CAS (column address strobe), and /WE (write enable), and decodes the received control signals. Decoding results of the control signals are then supplied to the control-signal latch 15 and the mode register 16. The control-signal latch 15 latches the decoding results supplied from the command decoder 12. The latched decoding results are used for controlling operations of the banks 18.

The address-buffer/register unit 13 receives address signals A0 through A11, and supplies address data to the mode register 16, the column-address counter 17, and the banks 18. As shown in the figure, two banks 18 are provided as an example, and the bank address A11 is used for selecting one of these two banks.

The mode register 16 stores parameters such as a CAS latency and a burst length. An instruction to store parameters in the register is given by the control signals, and the contents of parameters are specified by the address data.

The column-address counter 17 generates consecutive column addresses successively when an access is to be made to consecutive column addresses at the same row address. The generated column addresses are supplied to the banks 18.

In each of the banks 18, data of memory cells indicated by a supplied row address is read from the memory-cell array, and is stored in the sense amplifiers. Then, data is supplied to the I/O-data-buffer/register unit 14 from the sense amplifiers corresponding to a supplied column address. In the case of a data-write operation, the same operations are performed in a reversed order.

The stt-generation circuit 19 generates a start signal STTZ for a predetermined time period upon supply of a power voltage to the semiconductor memory device 10. The start signal STTZ is supplied to the start-up-period control circuit 20.

The start-up-period control circuit 20 also receives a mode-register-set signal MRS from the command decoder 12. The mode-register-set signal MRS is generated when a mode is to be set in the mode register 16, and is of a conventional use in the related-art semiconductor memory devices. An appropriate combination of the control signals input to the command decoder 12 prompts generation of the mode-register-set signal MRS. In the synchronized semiconductor memory device 10, generally, the mode-register-set signal MRS is generated at the time of start-up of the device.

The start-up-period control circuit 20 changes a lock signal Lockz to HIGH when the start signal STTZ is activated upon supply of the power voltage. Then, the mode-register-set signal MRS is supplied to the start-up-period control circuit 20 as the semiconductor memory device 10 starts operations thereof. Upon receiving the mode-register-set signal MRS, the start-up-period control circuit 20 changes the lock signal Lockz to LOW. The lock signal Lockz is supplied to the dummy-current generation circuit 21 and the DLL circuit 22.

When the lock signal Lockz is HIGH, the dummy-current generation circuit 21 is activated so as to consume a predetermined amount of electric current, and the DLL circuit 22 engages in an operation thereof to adjust a timing of an internal clock signal. The predetermined amount of electric current is equivalent to a current consumption which is observed during when the semiconductor memory device 10 engages in a predetermined operation. Because of this, the DLL circuit 22 makes an adjustment to the internal clock signal while this predetermined amount of current is consumed.

When the lock signal Lockz becomes LOW, the dummy-current generation circuit 21 stops operations thereof, putting an end to the current consumption thereof. Further, the DLL circuit 22 stops operating, so that the timing of the internal clock signal is fixed to an adjusted timing.

When a current is consumed in a semiconductor device, in general, the power voltage supplied to the semiconductor device drops because of the current consumption. As the power voltage drops, response characteristics of the internal circuits of the semiconductor device are changed, thereby giving rise to a displacement in the synchronization-signal timings. In order to prevent such a timing displacement, a conventional DLL circuit of the semiconductor device incessantly operates with an aim of achieving a stable operation of the synchronization signals.

In the present invention, the dummy-current generation circuit 21 consumes the predetermined amount of current which is equivalent to the current consumption observed during the predetermined operation of the semiconductor device, and the DLL circuit 22 adjusts a timing of the internal clock signal under this condition. This timing adjustment is made immediately after starting supply of the power voltage to the semiconductor device. When the semiconductor device starts operating upon a completion of the timing adjustment, the dummy-current generation circuit 21 stops operating, and the DLL circuit 22 also stops operations thereof to fix the internal clock signal to the adjusted timing. Thereafter, the internal clock signal having this fixed timing will be used at all times. When the semiconductor device performs the above predetermined operation, therefore, the internal clock signal provides an optimum timing since the timing adjustment has been made in advance under such a current-consumption condition as should be observed during this predetermined operation.

In this manner, the present invention allows a predetermined amount of current to be consumed as an emulation immediately after a start of supply of the power voltage, and a timing of the internal clock signal is adjusted under this condition, followed by the subsequent fixing of this timing upon completion of the adjustment. When the semiconductor device starts operating, and engages in the predetermined operation in which the predetermined amount of current is consumed, the internal clock signal has such timing as is appropriate under this predetermined operation.

Where the internal clock signal is used as a synchronization signal for data output, for example, the dummy-current generation circuit 21 emulates an amount of current which would be consumed by the semiconductor memory device 10 during the data-read operations. This allows the internal clock signal to be fixed to such timing as should be appropriate during the data-read operations.

FIGS. 3A through 3F are timing charts for explaining the operations of the semiconductor memory device 10 according to the present invention.

As shown in the figures, when a power voltage VCC is applied, the start signal STTZ is generated for a predetermined time period. In response, the dummy-current generation circuit 21 starts consuming an electric current, and, upon arriving at a stable condition, a current ICC consumed by the entirety of the semiconductor memory device 10 becomes C [mA]. Under this condition, the DLL circuit 22 adjusts a timing of the internal clock signal. After this, the mode-register-set signal MRS is input as a command, following the start of operation of the semiconductor memory device 10. In response to the mode-register-set signal MRS, the dummy-current generation circuit 21 stops operating, and the DLL circuit 22 also ends the operation thereof to fix the timing of the internal clock signal. When the operation conditions of the semiconductor memory device 10 are changed, the semiconductor memory device 10 consumes a different amount of a current, which varies from A [mA], B [mA], C [mA], to D [mA]. Under a operation condition (operation mode) in which the data signal DQ is read, the semiconductor memory device 10 consumes C [mA] as was exactly consumed during the adjustment period. The internal clock signal thus has an optimal timing as a synchronization signal for the data-read operation.

Figure 4:
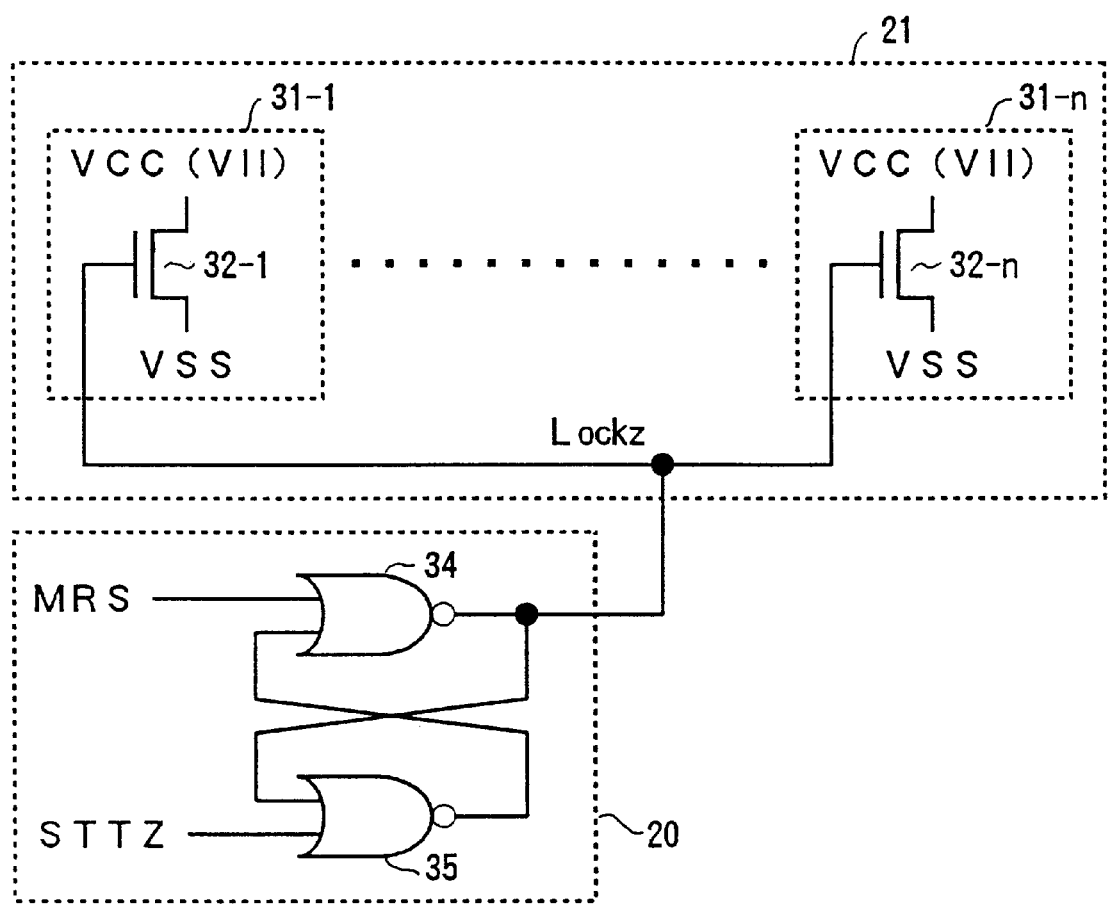
FIG. 4 is a circuit diagram showing a circuit configuration of a start-up-period control circuit and a dummy-current generation circuit.

FIG. 4 is a circuit diagram showing a circuit configuration of the start-up-period control circuit 20 and the dummy-current generation circuit 21.

As shown in FIG. 4, the dummy-current generation circuit 21 includes a plurality (n) of current consuming units 31-1 through 31-n. In an example of FIG. 4, the current consuming units 31-1 through 31-n include NMOS transistors 32-1 through 32-n. The start-up-period control circuit 20 includes NOR circuits 34 and 35. The NOR circuits 34 and 35 together form a latch, which receives the mode-register-set signal MRS and the start signal STTZ as two inputs thereto.

In an initial condition, the mode-register-set signal MRS and the start signal STTZ are LOW. At this time, the latch is in a state in which the lock signal Lockz is LOW.

When the start signal STTZ becomes HIGH upon supply of the power voltage to the semiconductor memory device 10, the lock signal Lockz changes to HIGH, and such a new state is held by the latch. Even when the start signal STTZ subsequently returns to LOW, therefore, the lock signal Lockz remains at the HIGH level. When the lock signal Lockz is HIGH, the NMOS transistors 32-1 through 32-n are turned on, so that a predetermined amount of an electric current flows through each of the NMOS transistors 32-1 through 32-n. A total amount of these electric currents (n times each currents) emulates the current consumption which would be observed under a predetermined operational condition.

When the mode-register-set signal MRS subsequently becomes HIGH (while the start signal STTZ is LOW), the lock signal Lockz returns to LOW, and such a state is stored in the latch. Even when the mode-register-set signal MRS returns to LOW, therefore, the lock signal Lockz maintains the LOW level thereof.

Accordingly, the dummy-current generation circuit 21 stops operating when the mode-register-set signal MRS changes to HIGH following a start of the operation of the semiconductor memory device 10.

Figure 5:
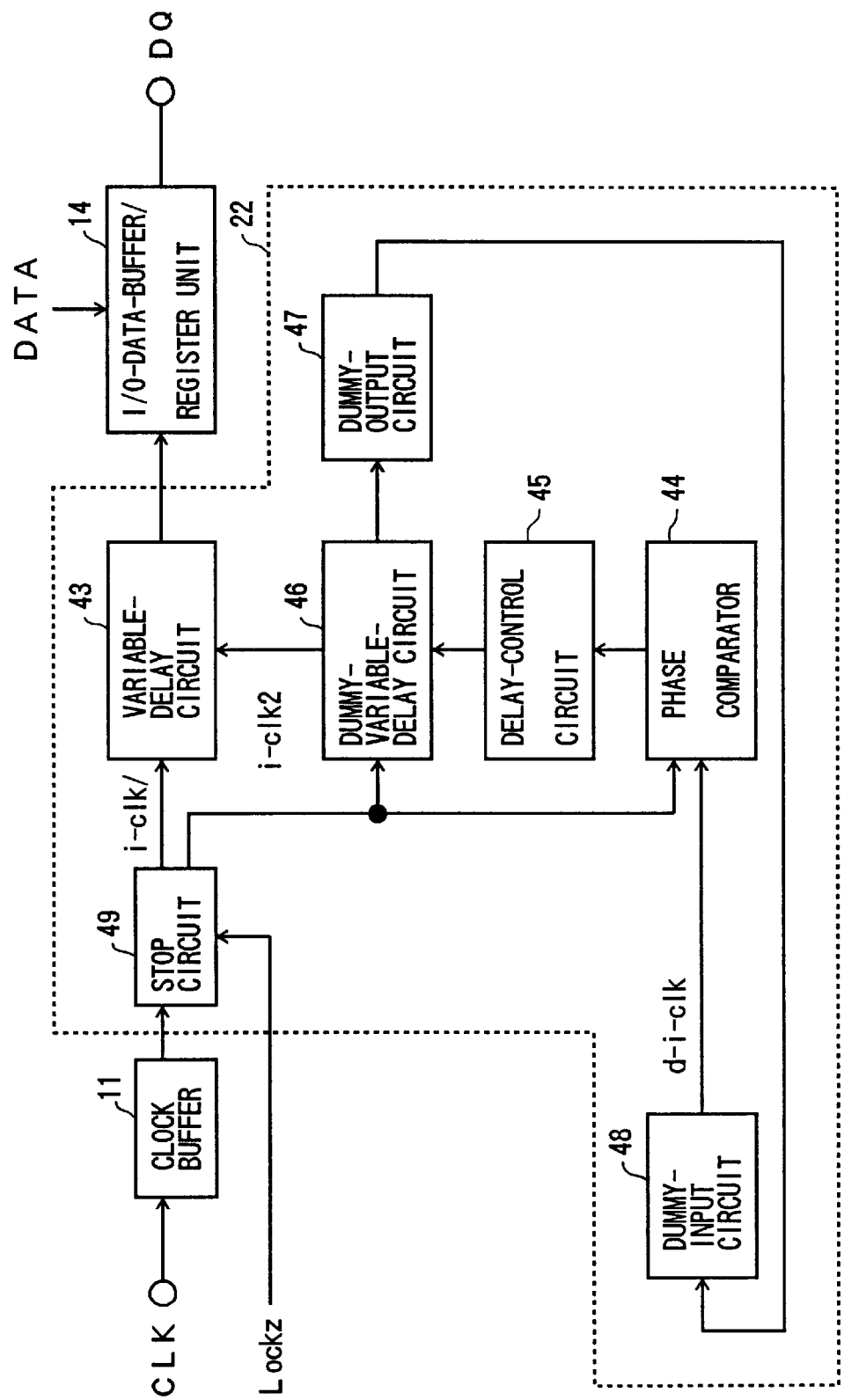
FIG. 5 is a block diagram of a DLL circuit.

FIG. 5 is a block diagram of the DLL circuit 22. FIG. 5 shows an example in which the DLL circuit 22 is used for adjusting a data-output timing.

The DLL circuit 22 of FIG. 5 includes a variable-delay circuit 43, a phase comparator 44, a delay-control circuit 45, a dummy-variable-delay circuit 46, a dummy-output circuit 47, a dummy-input circuit 48, and a stop circuit 49.

A clock signal CLK input to the clock buffer 11 (see FIG. 1) is supplied to the stop circuit 49, which in turn outputs clock signals i-clk1 and i-clk2 having the same phase. The clock signal i-clk1 is then delayed by the variable-delay circuit 43 by an appropriate delay amount, and is supplied to the I/O-data-buffer/register unit 14. The I/O-data-buffer/register unit 14 uses the supplied internal-clock signal as a synchronization signal for latching data DATA which is supplied from the banks 18. The latched data DATA is then supplied from the I/O-data-buffer/register unit 14 to an exterior of the semiconductor memory device 10 as data DQ.

The signal path from an input node of the clock signal CLK to the I/O-data-buffer/register unit 14 inevitably introduces a delay which is inherent to the circuit, so that the data DQ output to the exterior of the device has a timing displacement relative to the clock signal CLK. In order to ensure that the data DQ output from the I/O-data-buffer/register unit 14 is adjusted to have a predetermined timing relation with the externally provided clock signal CLK, a DLL circuit mainly comprised of the phase comparator 44, the delay-control circuit 45, and the dummy-variable-delay circuit 46 is employed.

The clock signal i-clk2 is supplied to the dummy-variable-delay circuit 46. The dummy-variable-delay circuit 46 is controlled to delay the clock signal i-clk2 by the same delay amount as that applied by the variable-delay circuit 43. The delayed-clock signal output from the dummy-variable-delay circuit 46 is then supplied to the dummy-output circuit 47, which emulates the I/O-data-buffer/register unit 14. The clock signal output from the dummy-output circuit 47 is supplied as a dummy-clock signal d-i-clk to the phase comparator 44 via the dummy-input circuit 48, which has the same delay characteristics as the clock buffer 11.

The phase comparator 44 makes a comparison of the clock signal i-clk2 with the dummy-clock signal d-i-clk in terms of their phases. To ensure that both clock signals have the same phase, the phase comparator 44 controls the delay amount of the dummy-variable-delay circuit 46 via the delay-control circuit 45. In this manner, the clock signal output from the dummy-output circuit 47 is adjusted so as to have a predetermined timing relation with the input clock signal CLK.

A total delay of the variable-delay circuit 43 and the I/O-data-buffer/register unit 14 is equal to a total delay of the dummy-variable-delay circuit 46 and the dummy-output circuit 47. Because of this, when the clock signal output from the dummy-output circuit 47 has the predetermined timing relation with the input clock signal CLK, the data DQ output from the I/O-data-buffer/register unit 14 to the exterior of the device ends up having the same predetermined timing relation with the input clock signal CLK.

The stop circuit 49 receives the lock signal Lockz from the start-up-period control circuit 20, and stops supply of the clock signal i-clk2 when the lock signal Lockz is LOW. In this manner, when the semiconductor memory device 10 operates in a normal mode, the stop circuit 49 stops the DLL circuit 22 from adjusting timings, thereby fixing the timing of the internal clock signal and reducing the power consumption.

Figure 6:
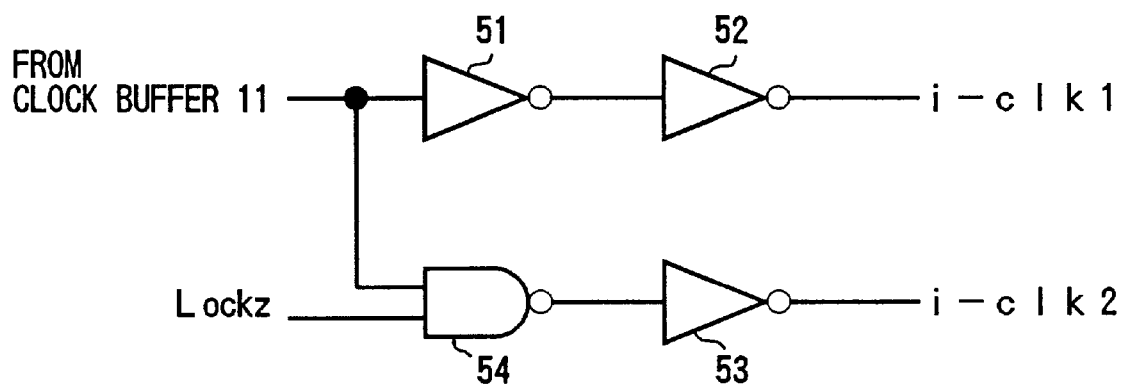
FIG. 6 is a circuit diagram showing a circuit structure of a stop circuit.

FIG. 6 is a circuit diagram showing a circuit structure of the stop circuit 49.

The stop circuit 49 includes inverters 51 through 53 and a NAND circuit 54. The lock signal Lockz is supplied to one input of the NAND circuit 54, and the other input thereof receives the clock signal from the clock buffer 11. Only when the lock signal Lockz is HIGH, therefore, will the clock signal i-clk2 be output. The inverters 51 and 52 are provided for the purpose of matching the phases between the clock signal i-clk1 and the clock signal i-clk2.

Figure 7:
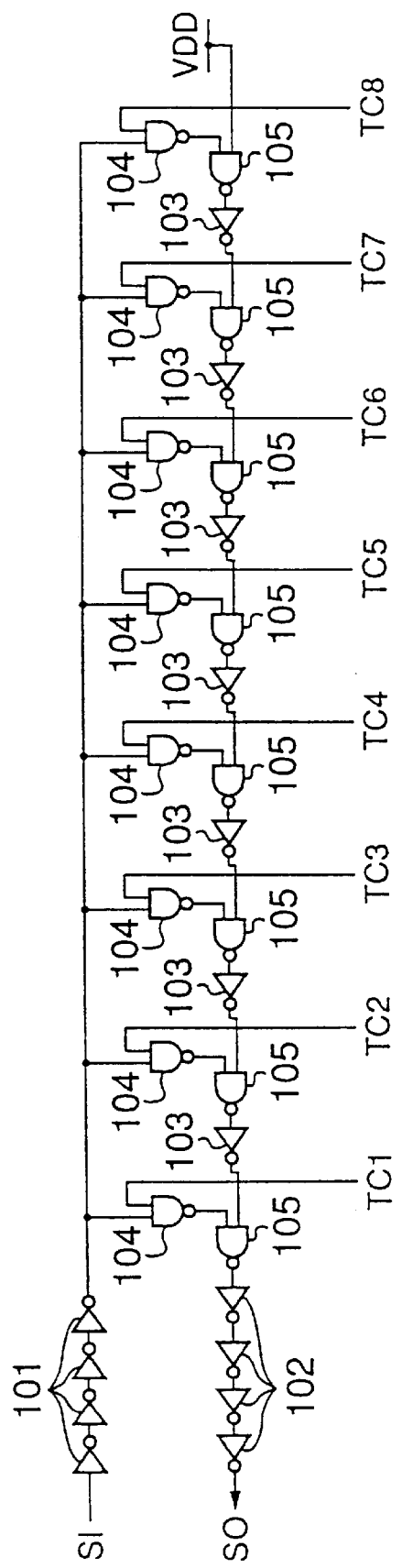
FIG. 7 is a circuit diagram showing a circuit structure of a variable-delay circuit.

FIG. 7 is a circuit diagram showing a circuit structure of a variable-delay circuit. The variable-delay circuit 43 and the dummy-variable-delay circuit 46 have the same circuit configuration shown in FIG. 7.

The variable-delay circuit of FIG. 7 includes a plurality of inverters 101, a plurality of inverters 102, a plurality of inverters 103, a plurality of NAND circuits 104, and a plurality of NAND circuits 105. A given one of the inverters 103 and a corresponding one of the NAND circuits 105 together form one stage of a delay element, such that the plurality of inverters 103 and the plurality of NAND circuits 105 together form a series of delay elements having a plurality of delay stages. Control signals TC1 through TC8 are supplied to the NAND circuits 104, and are provided from the delay-control circuit 45. A detailed description of the control signals TC1 through TC8 will be provided later. For the understanding of the circuit operations of FIG. 7, it should be pointed out that only two adjacent signals are HIGH among the control signals TC1 through TC8, and the remaining control signals are LOW.

An input signal S1 is supplied to the plurality of NAND circuits 104 via the plurality of inverters 101. The input signal S1 passes through a given one of the NAND circuits 104 when this NAND circuit 104 receives a HIGH signal as one of the control signals TC1 through TC8, and enters the series of delay elements comprised of the plurality of inverters 103 and the plurality of NAND circuits 105. The input signal SI propagates through the series of delay elements, and is output as an output signal SO after passing through the plurality of inverters 102. Depending on a position of the two adjacent signals which are HIGH among the control signals TC1 through TC8, the input signal SI passes through a different number of delay stages. Control of this position makes it possible to adjust how much the input signal SI is delayed.

Figure 8:
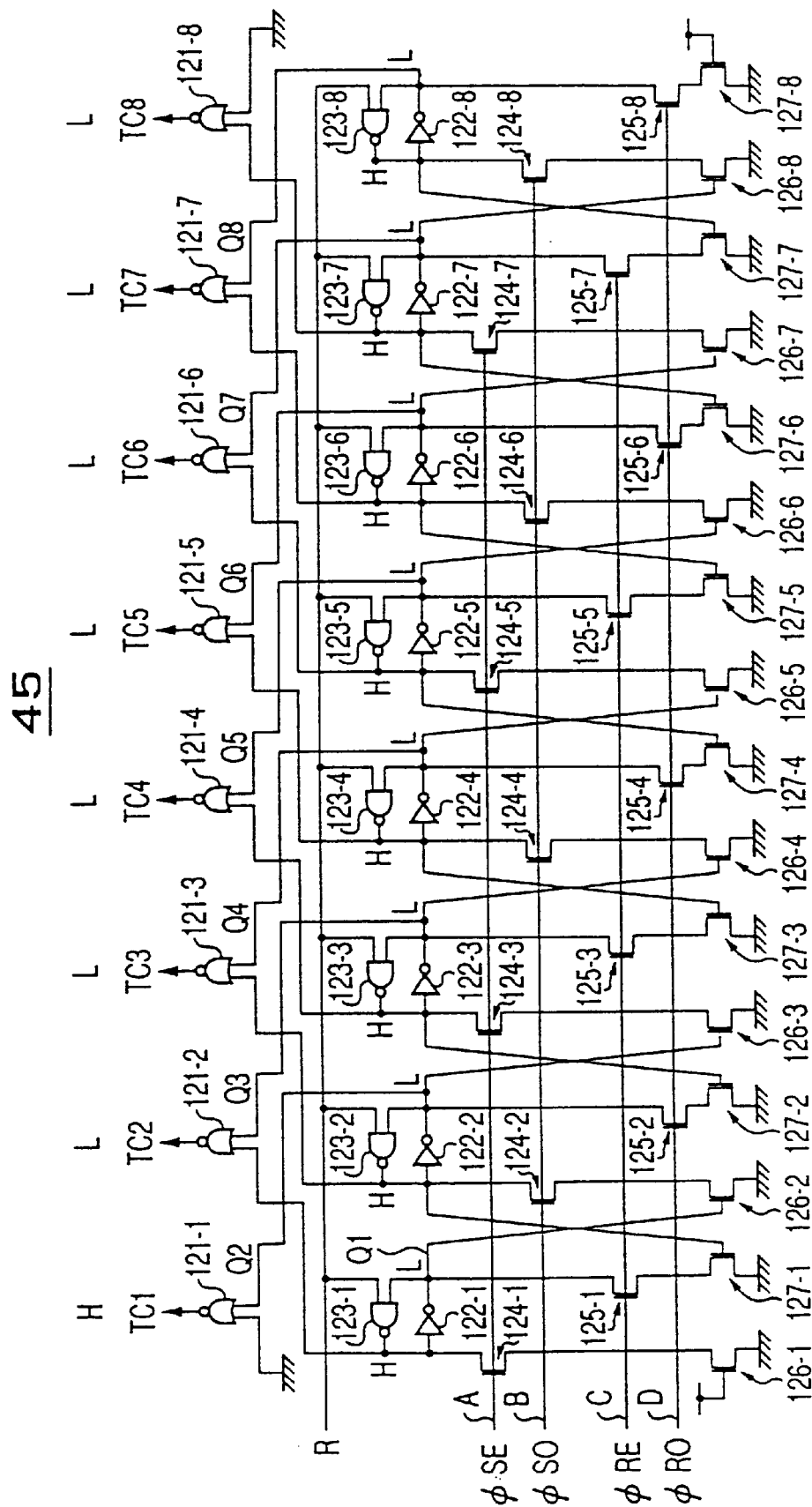
FIG. 8 is a circuit diagram of a delay-control circuit.

FIG. 8 is a circuit diagram of the delay-control circuit 45. The delay-control circuits 45 generates the control signals TC1 through TC8 described above.

The delay-control circuit includes NOR circuits 121-1 through 121-8, inverters 122-1 through 122-8, NAND circuits 123-1 through 123-8, NMOS transistors 124-1 through 124-8, NMOS transistors 125-1 through 125-8, NMOS transistors 126-1 through 126-8, and NMOS transistors 127-1 through 127-8. When a reset signal R is turned to LOW, the delay-control circuit 45 is reset. Namely, when the reset signal R becomes LOW, outputs of the NAND circuits 123-1 through 123-8 become HIGH, and outputs of the inverters 122-1 through 122-8 become LOW. A pair of a given one of the NAND circuits 123-1 through 123-8 and a corresponding one of the inverters 122-1 through 122-8 forms a latch in which one element of the pair receives an output of the other element as an input. An initial state created by the reset signal R is thus kept even after the reset signal R returns to HIGH.

In this initial state, the output TC1 of the NOR circuit 121-1 is HIGH as shown in FIG. 8, and the remaining NOR circuits 121-2 through 121-8 have the outputs TC2 through TC8, respectively, which are LOW. That is, only the output TC1 is HIGH among the outputs TC1 through TC8.

When there is a need to increase the amount of delay with respect to a signal subjected to phase adjustment, HIGH pulses are supplied to signal lines A and B in turn. With a HIGH pulse of a signal ΦSE supplied to the signal line A, the NMOS transistor 124-1 is turned on. Since the NMOS transistor 126-1 is in a turned-on state, an output of the NAND circuit 123-1 is connected to the ground, and is forced to change from HIGH to LOW, so that an output of the inverter 122-1 becomes HIGH. This condition is latched by the latch comprising the NAND circuit 123-1 and the inverter 122-1. As a result, the output TC2 is changed from LOW to HIGH. In this condition, therefore, only the outputs TC1 and TC2 are HIGH.

With a HIGH pulse of a signal ΦSO supplied to the signal line B, the NMOS transistor 124-2 is turned on. Since the NMOS transistor 126-2 is already in a turned-on state, an output of the NAND circuit 123-2 is connected to the ground, and is forced to change from HIGH to LOW, so that an output of the inverter 122-2 becomes HIGH. This condition is latched by the latch comprising the NAND circuit 123-2 and the inverter 122-2. As a result, the output TC1 is changed from HIGH to LOW, while the output TC3 is turned from LOW to HIGH. In this condition, therefore, only the outputs TC2 and TC3 are HIGH.

As described above, HIGH pulses are supplied in turn to the signal lines A and B to shift a position to the right one by one when this position marks the only two HIGH outputs among the outputs TC1 through TC8.

When there is a need to decrease the delay amount, HIGH pulses are supplied to signal lines C and D in turn. Operations in this case are simply a reverse of the above-described operations, and a description thereof will be omitted.

The output signals TC1 through TC8 generated in this manner are supplied to the variable-delay circuit so as to adjust a delay of a signal when this signal is subjected to a phase adjustment.

Signals ΦSE, ΦSO, ΦRE, and ΦRO are supplied to the signal lines A through D. These signals ΦSE, ΦSO, ΦRE, and ΦRO are generated by the phase comparator 44 of FIG. 5.

Figure 9:
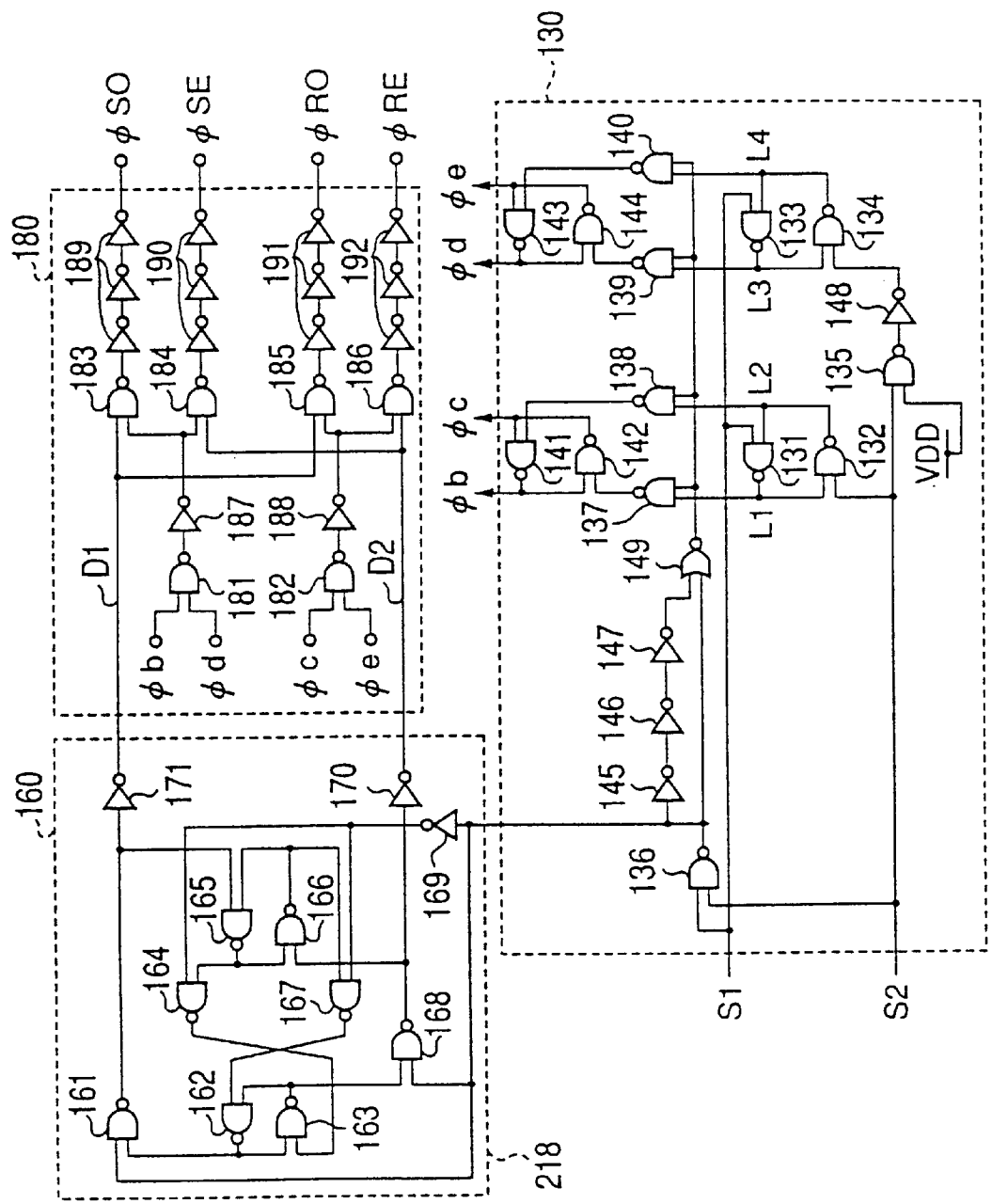
FIG. 9 is a circuit diagram showing a circuit configuration of a phase comparator.

FIG. 9 is a circuit diagram showing a circuit configuration of the phase comparator 44.

The phase comparator of FIG. 9 includes an edge-timing-comparison circuit 130, a binary counter 160, and a pulse-generation circuit 180.

The edge-timing-comparison circuit 130 includes NAND circuits 131 through 144, inverters 145 through 148, and a NOR circuit 149. The binary counter 160 includes NAND circuits 161 through 168 and inverters 169 through 171. The pulse-generation circuit 180 includes NAND circuits 181 through 186 and inverters 187 through 192.

The edge-timing-comparison circuit 130 receives input signals S1 and S2, and determines which one of the input signals S1 and S2 has a rising edge ahead of the other. One of the input signals S1 and S2 corresponds to the dummy-clock signal d-i-clk, and the other corresponds to the reference-clock signal c-clk2.

If a rising edge of the input signal S1 is ahead of a rising edge of the input signal S2, a latch comprised of the NAND circuits 131 and 132 produces outputs L1 and L2 which are LOW and HIGH, respectively. Also, a latch formed by the NAND circuits 133 and 134 generates output L3 and L4 which are LOW and HIGH, respectively.

After this, both of the input signals S1 and S2 become HIGH, which changes an output of the NAND circuit 136 to LOW. This prompts the NOR circuit 149 to produce a HIGH output for a predetermined period of time. The HIGH output of the NOR circuit 149 opens gates of the NAND circuits 137 through 140, so that the latch outputs L1 through L4 are inverted and input to two latches comprised of NAND circuits 141 through 144. The latch comprised of NAND circuits 141 and 142 thus has outputs Φb and Φc which are HIGH and LOW, respectively. Also, the latch comprised of NAND circuits 143 and 144 has outputs Φd and Φe which are HIGH and LOW, respectively.

In this manner, when the input signal S1 has a rising edge ahead in time, the NAND circuit 181 of the pulse-generation circuit 180 changes an output thereof to LOW.

When a rising edge of the input signal S2 is ahead of a rising edge of the input signal S1 by a sufficient margin, the latch outputs Φb and Φc become LOW and HIGH, respectively, and, also, the latch outputs Φd and Φe become LOW and HIGH, respectively. In this case, therefore, the NAND circuit 182 of the pulse-generation circuit 180 changes an output thereof to LOW.

When a rising edge of the input signal S2 is ahead of a rising edge of the input signal S1 only by a small margin, the latch comprised of the NAND circuits 133 and 134 produces the outputs L3 and L4 which are LOW and HIGH, respectively, because of a signal delay introduced by the NAND circuit 135 and the inverter 148. In this case, the latch outputs Φb and Φc are LOW and HIGH, respectively, whereas the latch outputs Φd and Φe are HIGH and LOW, respectively. The NAND circuits 181 and 182 of the pulse-generation circuit 180 thus do not change outputs thereof, and these outputs remain at the HIGH level.

In this manner, when a difference in rising-edge timings is small between the input signal S1 and the input signal S2, i.e., when the rising edges can be regarded as having the same timing, the phase comparator of FIG. 9 does not generate an output.

The binary counter 160 divides a frequency of a signal by half when receiving the signal from the NAND circuit 136 of the edge-timing-comparison circuit 130. The binary counter 160 outputs a frequency-divided signal D1 from the inverter 171, and outputs a frequency-divided signal D2 from the inverter 170. The signal from the NAND circuit 136 has the same cycle as the input signals S1 and S2. Because of this, the frequency-divided signal D1 output from the binary counter 160 becomes HIGH during even-number cycles of the input signals, for example. In this case, the frequency-divided signal D2 becomes HIGH during odd-number cycles.

In the pulse-generation circuit 180, the output of the NAND circuit 181 becomes LOW when the input signal S1 is ahead of the input signal S2, as previously described. On the other hand, when the input signal S2 is ahead in time by a sufficient margin, the output of the NAND circuit 182 becomes LOW.

When the input signal S1 is ahead in time, the output of the NAND circuit 181 is inverted by the inverter 187, and is supplied to the NAND circuit 183 and 184 as a HIGH signal. The NAND circuit 183 further receives the frequency-divided signal D1, and the NAND circuit 184 further receives the frequency-divided signal D2. In this case, therefore, the pulse-generation circuit 180 generates HIGH pulses as the signal ΦSE or the signal ΦSO in turn When the input signal S2 is ahead in time by a sufficient margin, the output of the NAND circuit 182 is inverted by the inverter 188, and is supplied to the NAND circuit 185 and 186 as a HIGH signal. The NAND circuit 185 further receives the frequency-divided signal D1, and the NAND circuit 186 further receives the frequency-divided signal D2. In this case, therefore, the pulse-generation circuit 180 generates HIGH pulses as the signal ΦRO and the signal ΦRE in turn.

These signals ΦSE, ΦSO, ΦRE, and ΦRO are supplied to the delay-control circuit 45 shown in FIG. 8. In this manner, the delay of the variable-delay circuit of FIG. 7 can be controlled via the delay-control circuit 45 of FIG. 8, depending on which one of the dummy-clock signal d-i-clk and the clock signal c-clk2 has a rising edge ahead of the other.

Figure 10:
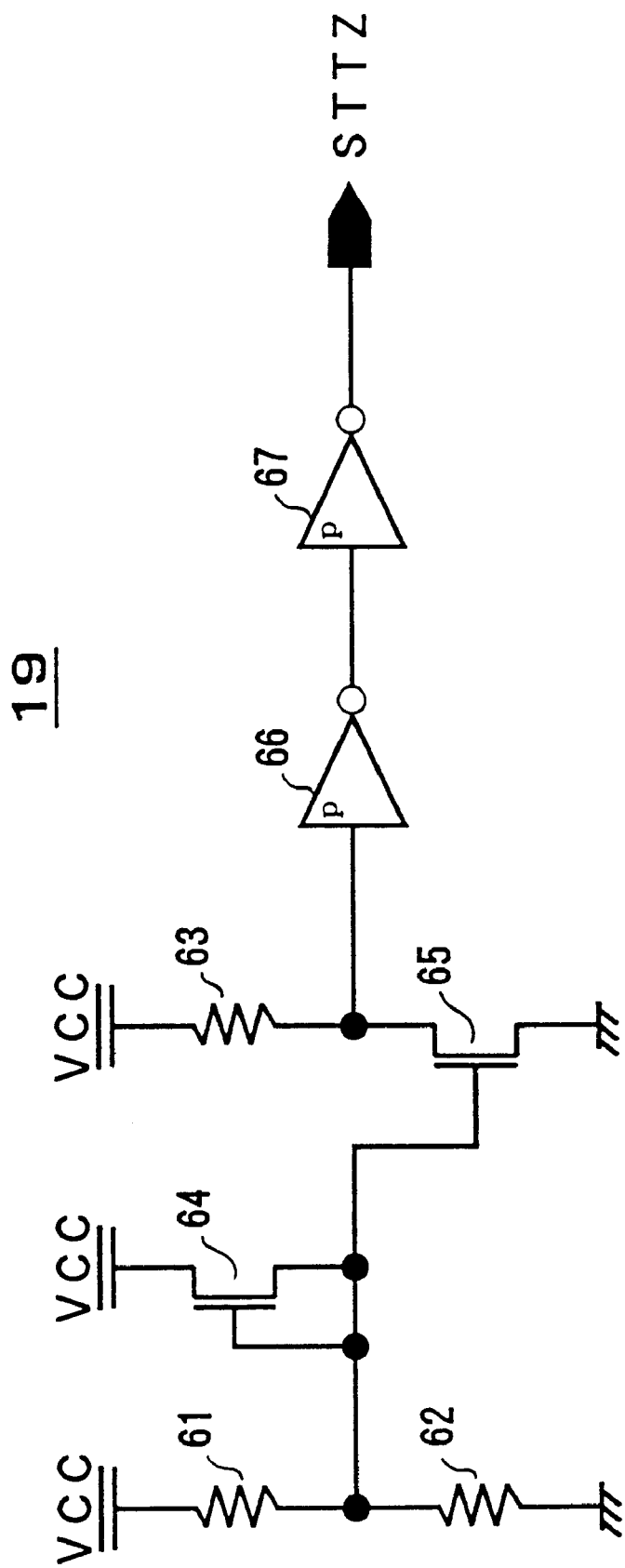
FIG. 10 is a circuit diagram showing a circuit configuration of a stt-generation circuit shown in FIG. 2.

FIG. 10 is a circuit diagram showing a circuit configuration of the stt-generation circuit 19 shown in FIG. 2.

The stt-generation circuit 19 of FIG. 10 includes resistors 61 through 63, NMOS transistors 64 and 65, and inverters 66 and 67. When the power voltage VCC is zero, the start signal STTZ is LOW. Also, the NMOS transistors 64 and 65 are OFF in this case. As the power voltage VCC gradually rises after the power-on of the device, this voltage appears at an output node as the start signal STTZ. When the voltage further rises and exceeds a predetermined voltage, the NMOS transistor 65 is turned on. When it comes to a point that the NMOS transistor 65 provides a current flow capacity exceeding that of the resistor 63, the start signal STTZ returns to LOW again.

Figure 3:
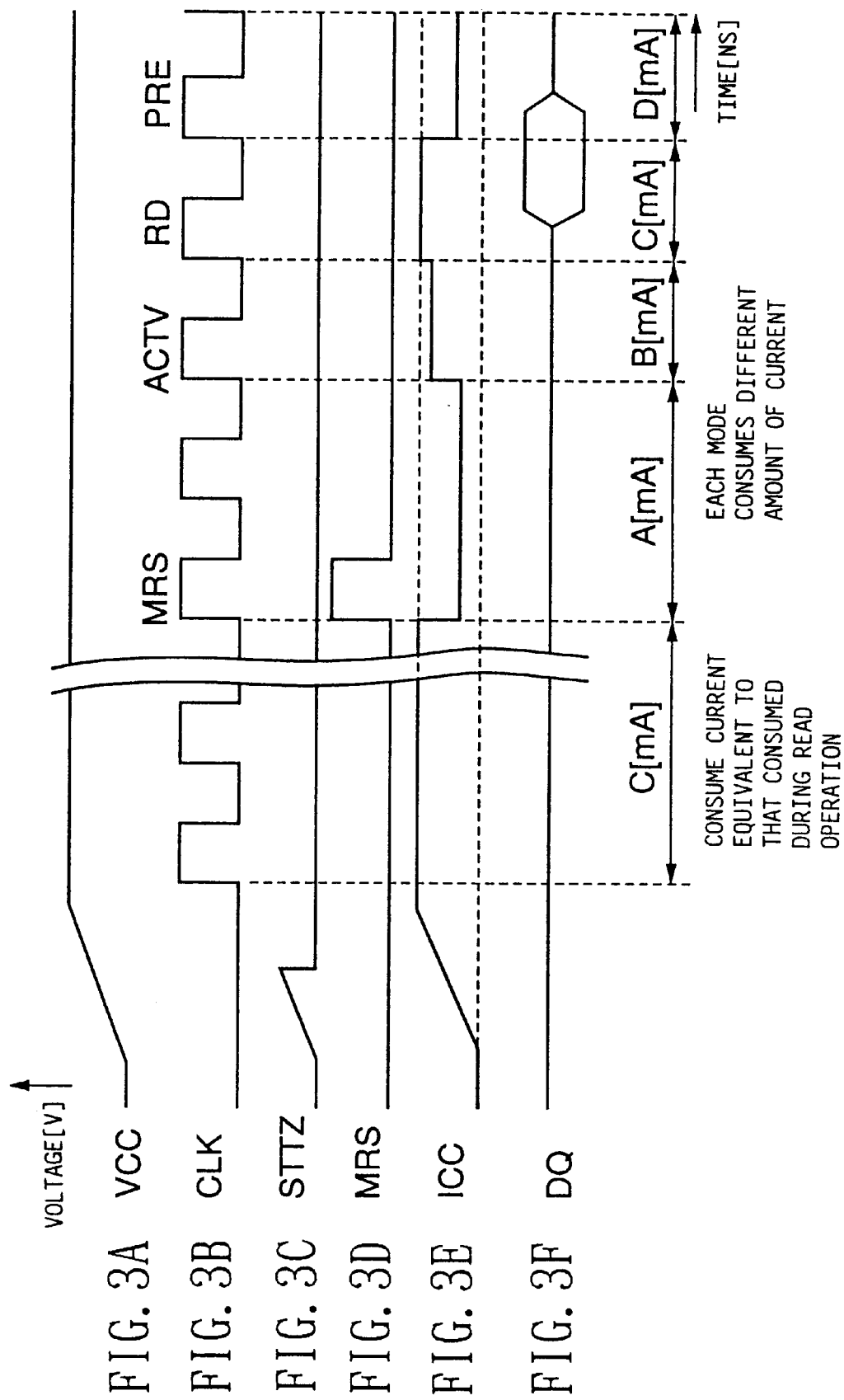
FIGS. 3A through 3F are timing charts for explaining operations of the semiconductor device according to the present invention.

In this manner, the start signal STTZ as shown in FIG. 3C is generated.

As previously described, the dummy-current generation circuit 21 emulates the current consumption of the semiconductor memory device 10. To perfect this objective, the dummy-current generation circuit 21 preferably emulates not only the amount of current consumption but also such specific positions of the current consumption within a chip as would be observed during the normal operations of the semiconductor memory device 10.

Figure 11:
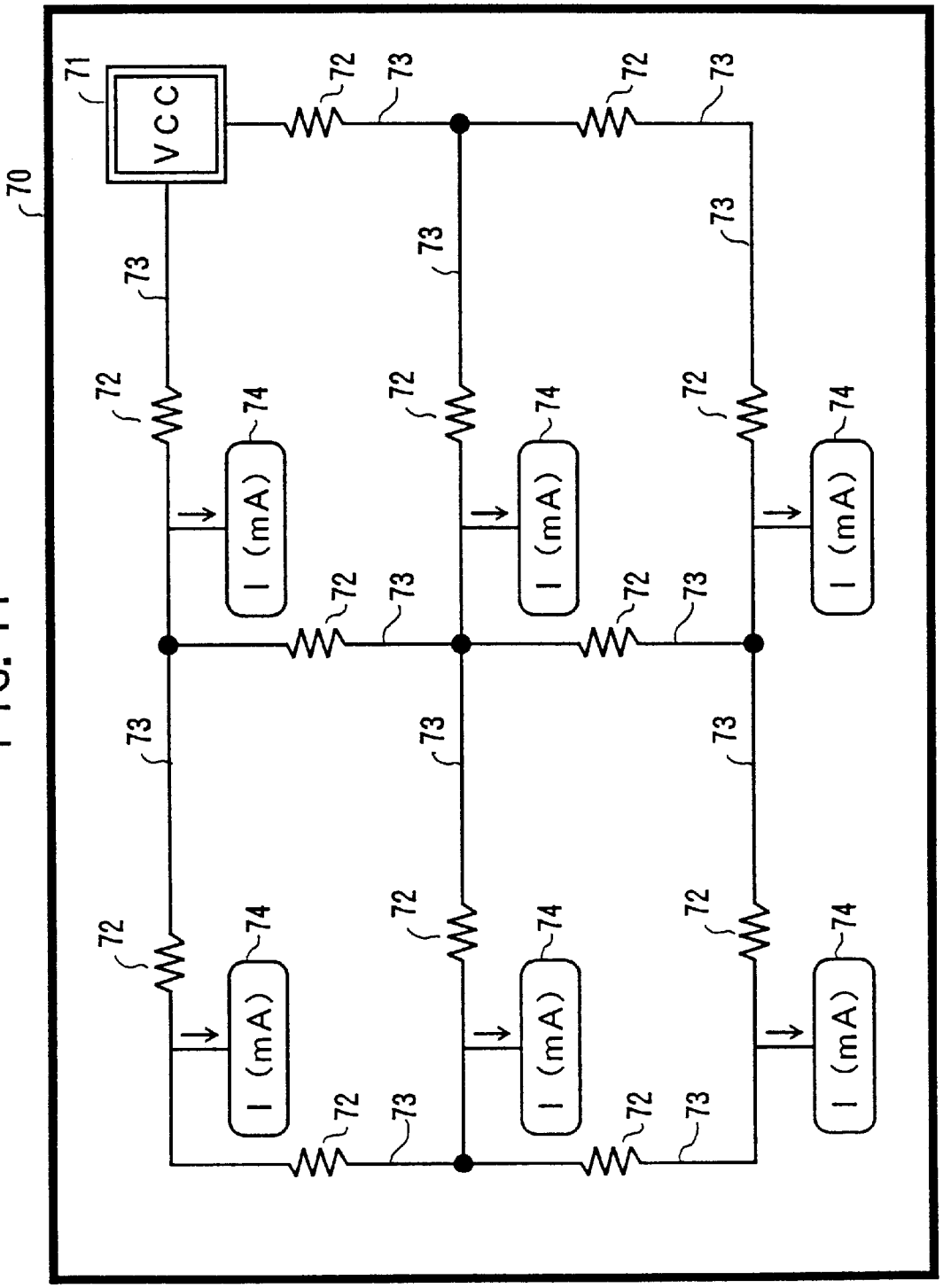
FIG. 11 is an illustrative drawing showing positions of current consumption within a chip.

FIG. 11 is an illustrative drawing showing positions of current consumption within a chip.

In a chip 70, the power voltage VCC supplied to a power-voltage node 71 is supplied to various positions via long-distance lines 73 which include a respective long-distance-line resistance 72. Each internal circuit 74 receives the power voltage VCC, and consumes an electric current of I [mA], for example. In a semiconductor device, generally, an electric current is consumed at various positions within the chip 70, as shown in an illustration of FIG. 11.

Figure 12:
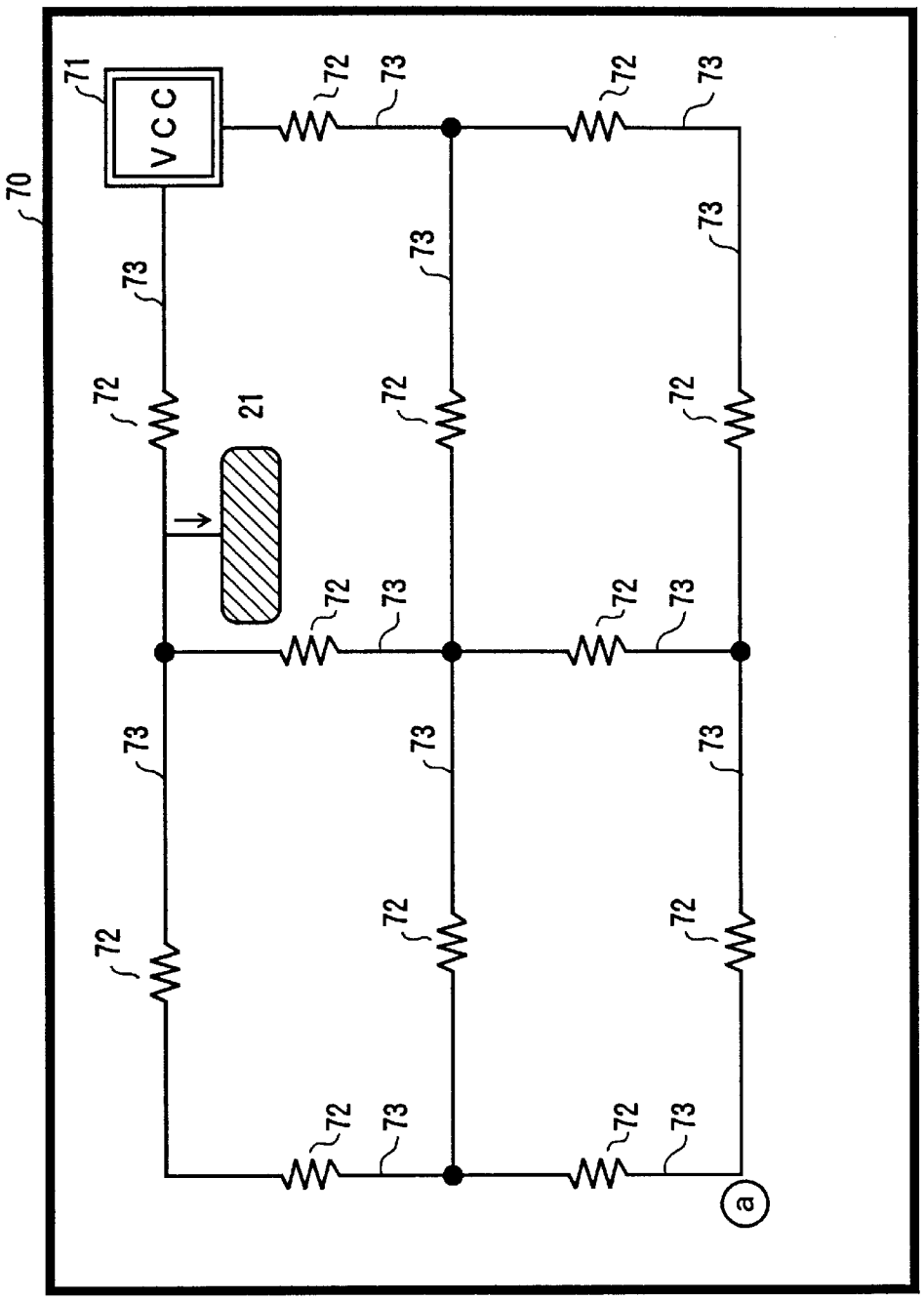
FIG. 12 is an illustrative drawing for explaining a problem that arises when the dummy-current generation circuit is situated at a single position inside a chip.

FIG. 12 is an illustrative drawing for explaining a problem that arises when the dummy-current generation circuit 21 is situated at a single position inside the chip.

The chip 70 of FIG. 12 is provided with the dummy-current generation circuit 21 which is a single circuit located at a single position. The dummy-current generation circuit 21 emulates the current consumption of FIG. 11 by consuming the power voltage VCC supplied from the power-voltage node 71 via the long-distance lines 73. A total current consumption by the chip 70 in FIG. 11 is 6I [mA], so that the dummy-current generation circuit 21 can emulate the conditions shown in FIG. 10 in terms of the total current consumption if the dummy-current generation circuit 21 alone consumes 6I [mA]. Since the dummy-current generation circuit 21 in such a case consumes 6I [mA] at a single location, however, conditions of a voltage reduction at a point a shown at the bottom left of the figure may be different from that of FIG. 11.

Figure 13:
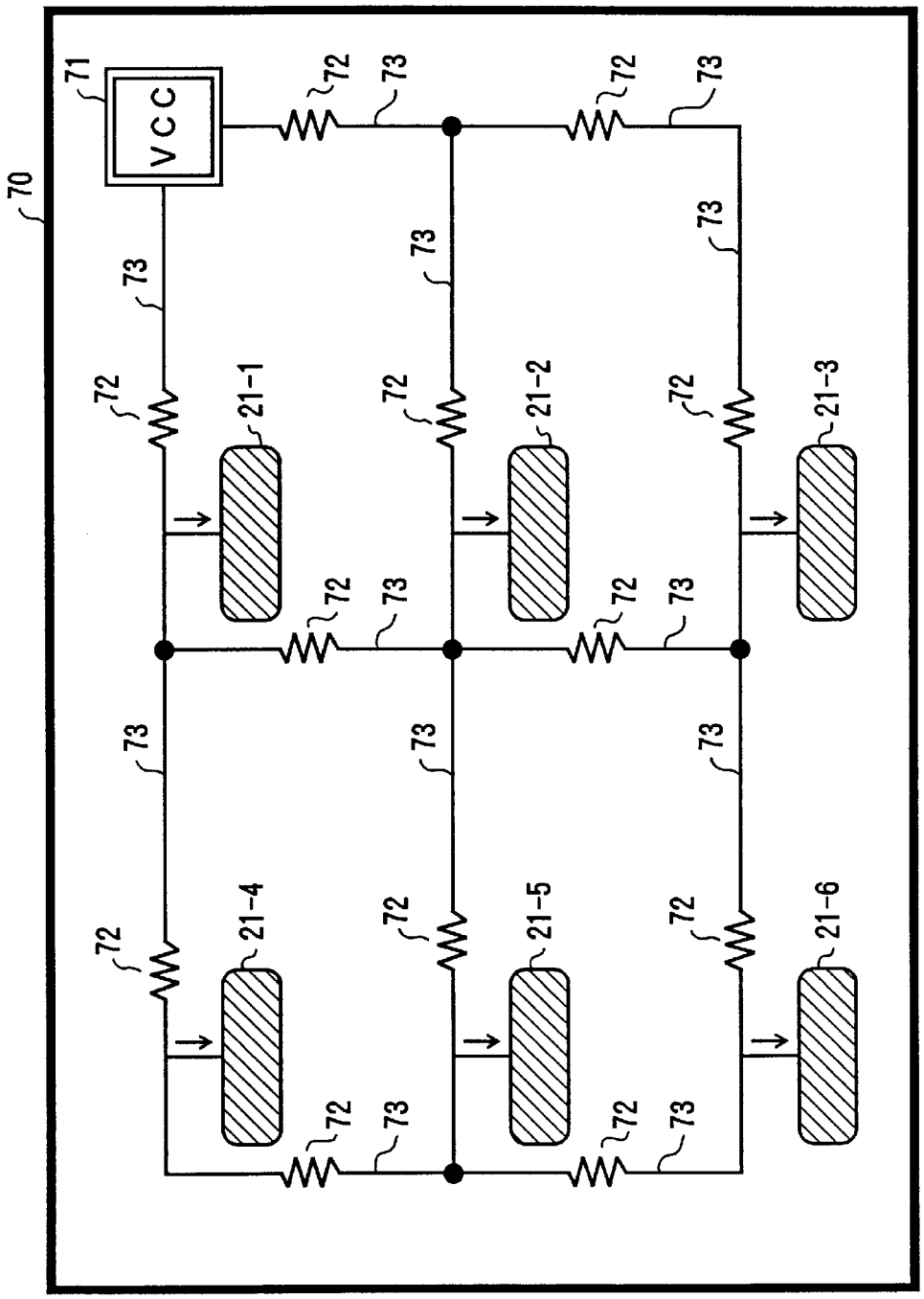
FIG. 13 is an illustrative drawing showing a case in which the dummy-current generation circuit is provided as a plurality of separate circuits at a plurality of different locations in a chip.

FIG. 13 is an illustrative drawing showing a case in which the dummy-current generation circuit 21 is provided as a plurality of separate circuits at a plurality of different locations in the chip.

In the chip 70 of FIG. 13, the dummy-current generation circuit 21 is divided into a plurality of circuits 21-1 through 21-6, and these circuits 21-1 through 21-6 are situated at different positions. The dummy-current generation circuits 21-1 through 21-6 consume the power voltage VCC supplied from the power-voltage node 71 via the long-distance lines 73 so as to emulate the current consumption of FIG. 11. In order to emulate the current consumption in terms of not only the total current consumption but also positions where current consumption takes place inside the chip 70, the dummy-current generation circuit 21-1 through 21-6 should consume I [mA] each.

In this manner, the dummy-current generation circuit 21 is provided as a plurality of separate circuits situated at different positions, thereby emulating the current consumption of the semiconductor device not only with regard to the total current consumption but also with regard to positions of the current consumption.

Figure 14:
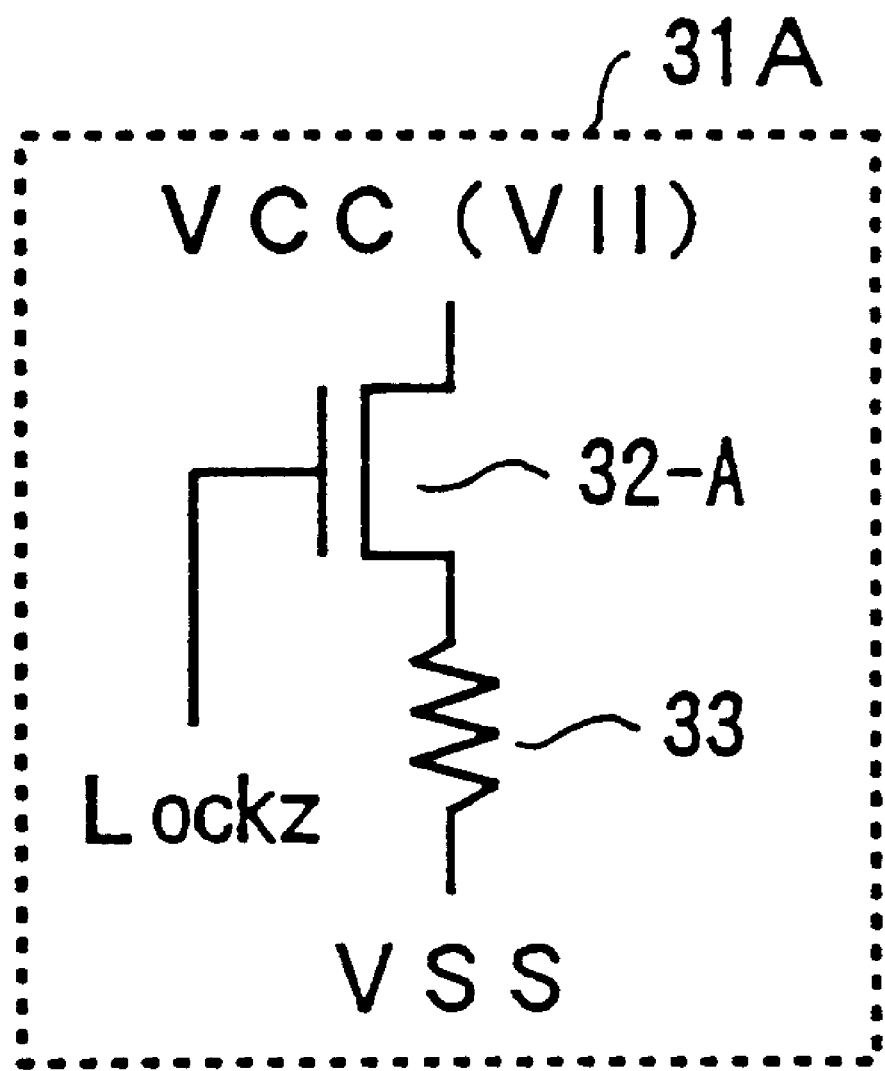
FIG. 14 is a circuit diagram showing another embodiment of the dummy-current generation circuit with respect to any one of current consuming units shown in FIG. 4.

FIG. 14 is a circuit diagram showing another embodiment of the dummy-current generation circuit 21 with respect to any one of the current consuming units 31-1 through 31-n shown in FIG. 4. FIG. 14 shows a configuration of one of the current consuming units 31-1 through 31-n.

The current consuming unit 31A of FIG. 14 includes an NMOS transistor 32A and a metal resistor 33. Transistors generally have product-by-product variations in their characteristics, and, also, current consumption by a transistor may change due to temperature-dependent characteristics of the transistor when there is a change in temperature. In order to avoid this, the current consuming unit 31A of FIG. 14 uses the metal resistor 33 since metal resistors usually have relatively small product-by-product variations in characteristics thereof and relatively small temperature-dependent characteristics. The NMOS transistor 32A merely serves as a switch, such that an amount of a consumed current is largely dependent on the resistance of the metal resistor 33.

With this configuration, an amount of a current consumed by the dummy-current generation circuit 21 can be selected with high accuracy.

Figure 15:
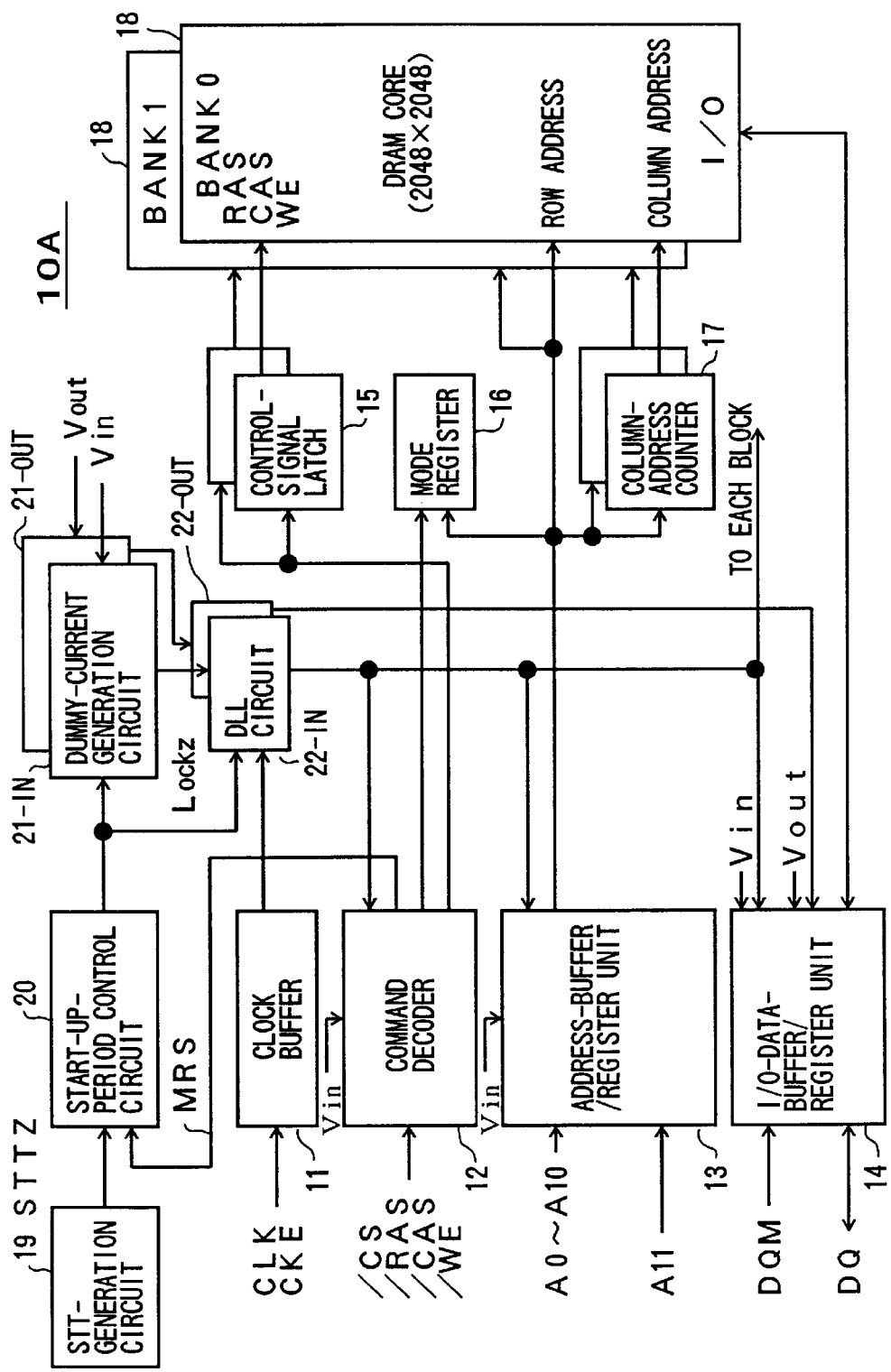
FIG. 15 is a block diagram of a semiconductor memory device where DLL circuits are separately provided for input-operation purposes and output-operation purposes.

FIG. 15 is a block diagram of a semiconductor memory device where DLL circuits are separately provided for input-operation purposes and output-operation purposes. In FIG. 15, the same elements as those of FIG. 2 are referred to by the same numerals, and a description thereof will be omitted.

A semiconductor memory device 10A of FIG. 15 includes a DLL circuit 22-IN for generating an internal clock signal for input-synchronization purposes and a DLL circuit 22-OUT for generating an internal clock signal for output-synchronization purposes. Further, a dummy-current generation circuit 21-IN and a dummy-current generation circuit 21-OUT are provided for the DLL circuit 22-IN and the DLL circuit 22-OUT, respectively.

The internal clock signal generated by the DLL circuit 22-IN is supplied to the command decoder 12, the address-buffer/register unit 13, and the I/O-data-buffer/register unit 14 to be used as a synchronization signal for latching respective input signals. Also, this internal clock signal is supplied to various internal circuits of the semiconductor memory device 10A as a synchronization signal. The internal clock signal generated by the DLL circuit 22-OUT is supplied to the I/O-data-buffer/register unit 14, and serves as a synchronization signal for outputting data.

The dummy-current generation circuit 21-IN emulates such current consumption of the semiconductor memory device 10A as observed when the semiconductor memory device 10A takes in the input signals. To this end, the dummy-current generation circuit 21-IN consumes a first predetermined amount of a current. The dummy-current generation circuit 21-OUT emulates such current consumption of the semiconductor memory device 10A as observed when the semiconductor memory device 10A outputs the data. For this purpose, the dummy-current generation circuit 21-OUT consumes a second predetermined amount of a current. During these periods of the current-consumption emulations, the DLL circuit 22-IN and the DLL circuit 22-OUT adjust the respective internal clock signals in terms of their timings. The timings of the internal clock signals are subsequently fixed, and the operations of the DLL circuit 22-IN and the DLL circuit 22-OUT are stopped.

In FIG. 15, separate power-voltage nodes are provided such that an input power voltage Vin and an output power voltage Vout are supplied to an input-operation-purpose power-voltage node and an output-operation-purpose power-voltage node, respectively. The input power voltage Vin is consumed by the dummy-current generation circuit 21-IN during the period of emulation, and is consumed by the command decoder 12, the address-buffer/register unit 13, and the I/O-data-buffer/register unit 14 during the period of signal-input operations in a normal operation mode. The output power voltage Vout is consumed by the dummy-current generation circuit 21-OUT during the period when emulation is conducted, and is consumed by the I/O-data-buffer/register unit 14 during the data-output operations in the normal operation mode.

In this manner, where separate DLL circuits are provided for the data-input purposes and the data-output purposes, separate power voltages are supplied for these different purposes. Emulation of current consumption which would be made during the normal operations of the semiconductor device is performed with respect to each of the separate power voltages, and the timings of the internal clock signals are adjusted under the emulated current-consumption conditions.

Further, the present invention is not limited to these embodiments, but various variations and modifications may be made without departing from the scope of the present invention.

What is claimed is:

1. A semiconductor device which performs a predetermined operation, said semiconductor device comprising:
   a timing-stabilization circuit which performs a timing adjustment with respect to an internal clock signal;
   a current-consumption circuit which consumes a predetermined amount of a current so as to emulate conditions of such current consumption as would be observed during said predetermined operation of said semiconductor device; and a start-up-period control circuit which makes said timing-stabilization circuit and said current-consumption circuit operate at a beginning of power supply so as to perform said timing adjustment under said conditions, and stops operations of said timing-stabilization circuit and said current-consumption circuit after completion of said timing adjustment.

2. The semiconductor device as claimed in claim 1, further comprising a first circuit which generates a first signal upon detecting said beginning of power supply, wherein said start-up-period control circuit makes said timing-stabilization circuit and said current-consumption circuit operate in response to said first signal.

3. The semiconductor device as claimed in claim 2, further comprising a second circuit which generates a second signal in response to an external input supplied in conjunction with a start of operations of said semiconductor device, wherein said start-up-period control circuit stops operations of said timing-stabilization circuit and said current-consumption circuit in response to said second signal.

4. The semiconductor device as claimed in claim 1, wherein said current-consumption circuit comprises at least one transistor.

5. The semiconductor device as claimed in claim 4, wherein said current-consumption circuit further comprises a resistor connected in series with said at least one transistor.

6. The semiconductor device as claimed in claim 5, wherein said at least one transistor has an ON resistance smaller than a resistance of said resistor, and a temperature-dependent resistance change of said resistor is smaller that a temperature-dependent ON-resistance change of said at least one transistor.

7. The semiconductor device as claimed in claim 1, wherein said current-consumption circuit includes a plurality of separate circuits provided at different positions within said semiconductor device, each of said separate circuits consuming a respective current.

8. The semiconductor device as claimed in claim 1, wherein said timing-stabilization circuit includes a DLL circuit.

9. The semiconductor device as claimed in claim 1, further comprising:
a plurality of timing-stabilization circuits each performing a respective timing adjustment regarding a respective internal clock signal, said plurality of timing-stabilization circuits including said timing-stabilization circuit; and
a plurality of current-consumption circuits which consumes a respective predetermined amount of a current with respect to a respective power voltage, said current-consumption circuits including said current-consumption circuit,
wherein said start-up-period control circuit makes said plurality of timing-stabilization circuits and said plurality of current-consumption circuits operate at said beginning of power supply, and stops operations of said plurality of timing-stabilization circuits and said plurality of current-consumption circuits after completion of said respective timing adjustment, thereby performing said respective timing adjustment under such respective conditions as would be observed when said semiconductor device operates by using said respective internal clock signal.

\* \* \* \* \*